United States Patent
Marshall (12) 
(10) Patent No.: US 6,377,599 B1
(45) Date of Patent: Apr. 23, 2002

(54) FOCUSABILITY ENHANCING OPTIC FOR A LASER DIODE

(75) Inventor: Larry R. Marshall, Mountain View, CA (US)

(73) Assignee: Iridex Corporation, Mountain View, CA (US)

( * ) Notice: Subject to any disclaimer, the term of this patent is extended or adjusted under 35 U.S.C. 154(b) by 0 days.

(21) Appl. No.: 09/229,461

(22) Filed: Jan. 12, 1999

(51) Int. Cl.$^7$ ............................................. H01S 3/0941
(52) U.S. Cl. ......................................... 372/75; 359/833
(58) Field of Search .................. 372/100, 75; 359/833, 359/834, 618, 627

(56) References Cited

U.S. PATENT DOCUMENTS

| | | | | |
|---|---|---|---|---|
| 2,447,828 A | * | 8/1948 | West ........................... 359/495 |
| 3,584,226 A | * | 6/1971 | Lerner ...................... 250/222.1 |
| 3,625,587 A | * | 12/1971 | Harrick ........................ 385/36 |
| 3,782,823 A | * | 1/1974 | Kantorski ..................... 356/85 |
| 5,513,201 A | * | 4/1996 | Yamaguchi ................... 372/75 |
| 5,808,803 A | * | 9/1998 | Ullman ....................... 359/641 |
| 5,920,664 A | * | 7/1999 | Hirabayashi ................. 385/16 |
| 6,028,722 A | * | 2/2000 | Lang .......................... 359/834 |

* cited by examiner

*Primary Examiner*—Paul Ip
*Assistant Examiner*—Gioacchino Inzirillo
(74) *Attorney, Agent, or Firm*—Wilson Sonsini Goodrich & Rosati (57) ABSTRACT

An optical device has a mount including a mount surface with a longitudinal axis. A diode source has a first diode emitter producing a first beam, a second diode emitter producing a second beam and a third diode emitter producing a third beam. The diode source is mounted above the mount surface at an angle θ relative to the longitudinal axis of the mount. A prism array has a first prism face, a second prism face and a third prism face. The prism array has an angled surface cut at the angle θ relative to a longitudinal axis of the prism array. The first, second and third beams are incident on the first, second and third prism faces respectively. Optical path lengths between the first, second and third diode emitters relative to the first, second and third prism faces are equal.

32 Claims, 9 Drawing Sheets

Single emitter

FIG. 1D

Diode Array

Collinate each emitter to form a line source

FOCUSABILITY ENHANCING OPTIC FOR A LASER DIODE

BACKGROUND OF THE INVENTION

1. Field of the Invention

This invention relates to an optical device for a diode array, and more particularly to an optical device for imaging the output of a diode array with a single optical element of unitary construction.

2. Description of Related Art

Conventional lasers have beams with circular symmetry. Standard optical lenses are frequently used to image their output beams into bright spots. Laser diodes form efficient pumping sources. Laser diodes have elliptical beam properties.

However, problems arise in focusing the output beams of diode arrays and bars onto a small spot or zone. In a diode bar, light energy from an active layer or region at a cleaved facet or edge of the diode in a slit-like pattern. This pattern has an oblong geometric configuration. Typical dimensions for a slit in a laser bar can be one micron high by 400 microns wide. The output beams emerge at large divergence angles from the small dimensions with a significantly lesser divergence angle from the large dimension.

With a single diode emitter the $m^2$ in the slow axis is much greater than the $m^2$ in the fast axis. The difference between the slow and fast axis is substantially increased for a diode array.

A pair of lenses has been used to image the output from a diode bar. In one embodiment, a lenticular array is used. The lenticular array changes the angle of divergence from a wide angle to a narrow angle for each diode laser. In this embodiment, there is one-to-one lens associate with each diode emitter. A second lens is used as an objective and focuses light to an image plane where a plurality of spots are formed. In this system, total convergence of the beams is not achieved.

Many techniques for collecting and subsequently focusing the output beam from a diode bar have been demonstrated for use in a variety of applications and in particular for end-pumping of solid-state lasers. Most of these techniques employ either an arrangement of cylindrical and spherical lenses or involve coupling light from each emitting region into a respective optical fiber.

In both of these cases, the minimum average beam diameter which can be produced and maintained over a length of a few millimeters is relatively large (typically>1 mm). One example of a typical focus for a diode bar is 0.1 mm×2 mm with an numerical aperture of about 0.5. This degree of focus can not be used to get into an optical fiber with a numerical aperture of about 0.2φ of about 0.5 mm.

Another disadvantage of these previously proposed techniques is the power loss produced by the arrangement of focusing optics or fibers. Again, this reduces the usefulness of the devices in applications such as end-pumping or surgical treatment devices where a high power output is required.

Fiber converters have been used for imaging the output of diode bars. See Grag, et al., *Opt. Lett.* 18, 1317 (1993). Image slicers have also been used to image the output of diode arrays. Image slicers divide a stellar image into parallel strips. This radiation is then redirected to form a line image with the strips running end to end. The resultant image is much narrowed compared with the original circular image and is well matched to a slit shape. Greater efficiency of the stellar radiation is achieved for a narrow slit.

For diode bars, it is desirable to progress from a line source to a symmetrical area source. This is essentially the operation of an image slicer in reverse. Several image slicer systems have been developed.

A stripe stacker has been used for diode bars. See Edwin *Optics Letters* 20(2), 222–224 (1994). The stripe stacker was used to operate an image slicer in reverse. The highly divergent diode output was initially collimated by a rod lens made of fused silica. The rod lens had a length of 122 mm and a diameter of 1.6 mm. A collimated beam with a cross section of approximately 1 mm×9 mm was created. The image was reformatted into a symmetrical area image by dividing the line source into three slices with a stripe stacker.

The stacker included three plane mirrors of precise thickness and shape. The plane of each mirror was inclined at an angle of 45° to the plane containing the diode bar output facet. Collimated beams were rotated by 90° at the mirror reflections. Each mirror intercepted the output from four diode stripes to create a 4×3 array of spots in a diamond shape. The stacker approach suffers a number of disadvantages including loss of output power and polarization.

In U.S. Pat. No. 5,825,551, the output from a laser diode array is collected using a collimating lens. The beam is then imaged by a combination of orthogonally arranged cylindrical and spherical lenses. Pump radiation enters a multiple reflection beam shaper which includes two parallel plane mirrors. If there are n emitters, the $N^{th}$ emitter is reflected 2N times to place it above the first emitter. The (N−1) emitter undergoes 2(N−1) reflections so there is a large path difference between beams. This causes a difference in size of each strip in the stack, giving a greater divergence, as well as the loss at each mirror is increased. This beam shaping device reconfigures the transverse spatial intensity profile of the beam such that the number of times by which the beam's divergence exceeds the diffraction limit in one plane, (i.e., the $m^2$ value for that plane, can be reduced) it is increased in the orthogonal plane.

There is a need for a simple optical system for imaging the output of a diode. A further need exists for a system that images the output of a diode with a single reflection where alignment sensitivity and losses are reduced. Yet a further need exists for a single optical element to image the output from a diode array. Still a further need exists for a simple optical system for imaging the output of a diode bar that provides easy alignment, preserves polarization and uses a single optical element of unitary construction.

SUMMARY OF THE INVENTION

Accordingly, an object of the invention is to provide an optical system for imaging the output of a diode array.

Another object of the invention is to provide a single optical element, optical system to image the output of a diode bar.

Still another object of the invention is to provide an optical system with minimal alignment difficulties for imaging the output of a diode bar.

Yet another object of the invention is to provide an optical system for imaging the output of a diode bar that preserves polarization.

A further object of the invention is to provide an optical system to image the output of a diode bar that uses a single optical element that is of a unitary construction.

These and other objects of the invention are achieved in an optical device with a mount, mount surface and a mount longitudinal axis. A single emitter diode source produces a first beam with an m² in the horizontal direction. A prism array is included with a plurality of reflective prism faces. The prism array is positioned relative to the single emitter diode source to redirect the first beam and form a reformatted beam with an improved m² in the horizontal direction.

In another embodiment, diode source has a first diode emitter producing a first beam, a second diode emitter producing a second beam and a third diode emitter producing a third beam. The diode source is mounted on the mount surface at an angle θ relative to the longitudinal axis of the mount. A prism array has a first prism face, a second prism face and a third prism face. The prism array has an angled surface cut at the angle θ relative to a longitudinal axis of the prism array. The first, second and third beams are incident on the first, second and third prism faces respectively. Optical path lengths between the first, second and third diode emitters relative to the first, second and third prism faces are equal.

In another embodiment, a diode source has a plurality of diode emitters that produce a plurality of diode output beams. The diode source is mounted on the mount surface at an angle θ relative to the longitudinal axis of the mount. The diode output beams collectively form an overlapped line source at a distance from the diode source equal to x. The prism array has an angled surface cut at the angle θ relative to a longitudinal axis of the prism array and is mounted above the mount surface at a distance from the diode greater than x. The prism array includes a plurality of prism faces. Each of the prism faces in the array reflects approximately equal fractions of tie beam.

In yet another embodiment, the present invention is a laser system. A high reflector and an output coupler define a laser cavity. A gain medium is positioned in the laser cavity. A mount has a mount surface with a longitudinal axis. A diode source includes a first diode emitter producing a first beam, a second diode emitter producing a second beam and a third diode emitter producing a third beam. The diode source is mounted on the mount surface at an angle θ relative to the longitudinal axis of the mount. The first, second and third beams collectively define a pump beam. A prism array includes a first prism face, a second prism face and a third prism face. The prism array has an angled surface cut at the angle θ relative to a longitudinal axis of the prism array. The angled surface of the prism array is positioned just above the mount surface. The first, second and third beams are incident on the first, second and third prism faces respectively. The optical path lengths between the first, second and third diode emitters relative to the first, second and third prism faces are equal. An intensity profile of the pump beam is tailored to produce a parabolic temperature gradient across the gain medium.

DETAILED DESCRIPTION

Figure 1A:
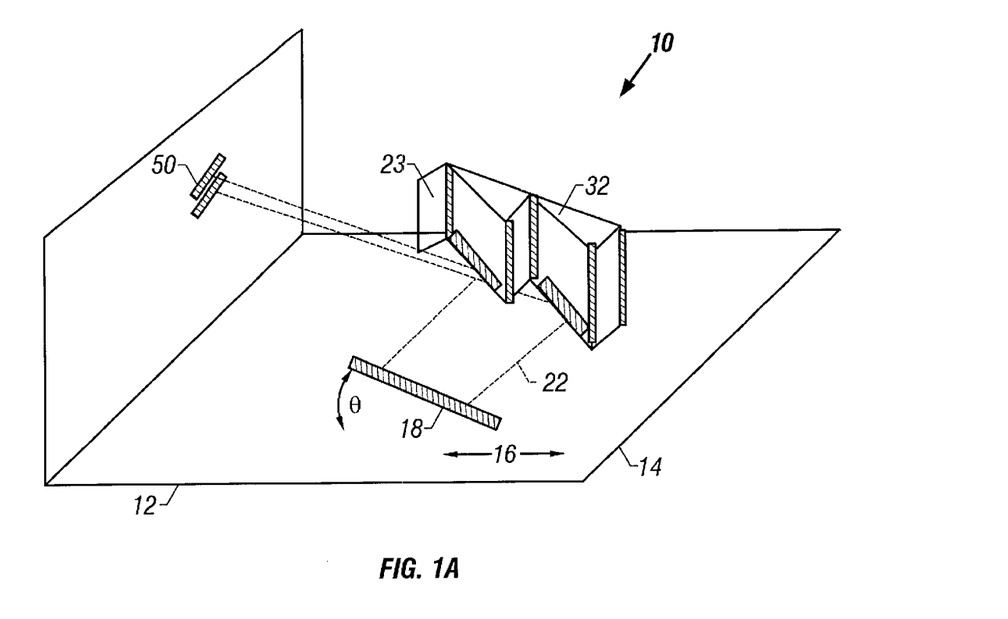
FIG. 1(a) is a perspective view of one embodiment of an optical device of the present invention utilizing a single diode emitter.

Referring to FIG. 1(a), one embodiment of an optical device 10 of the present invention is illustrated. Optical device 10 includes a mount 12 with a mount surface 14 and a longitudinal axis 16. In the embodiment of FIG. 1, a diode source 18 is a single emitter producing a first beam 22. Single emitter diode source 18 is mounted on mount surface 14 at an angle of θ relative to longitudinal axis 16. In the embodiment where diode source 18 is a single emitter, θ is preferably 5° to 10°. A prism array 32 is positioned just above mount surface 14 by a backing plate 23. Prism array 32 includes a plurality of reflective surfaces which serve to redirect first beam 22 to a reformatted output 50.

Figure 1B:
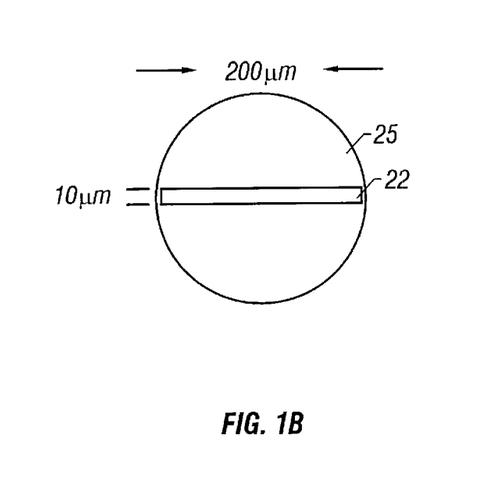
FIG. 1(b) illustrates the output beam of a single diode emitter focussed into an optical fiber prior to being reformatted.

One specific embodiment of a single emitter diode source 18 is illustrated in FIG. 1(b). In this embodiment, single emitter diode source 18 produces output beam 22 with dimensions of 10 μm by 200 μm. With these dimensions, output beam 22 can be focused into a 200 μm fiber 25. Prism array 32 is used to improve the focusability of single emitter diode source 18 into an optical fiber. In the case of the 200 μm beam, prism array 32 reformats beam 22 to provide symmetry.

Figure 1C:
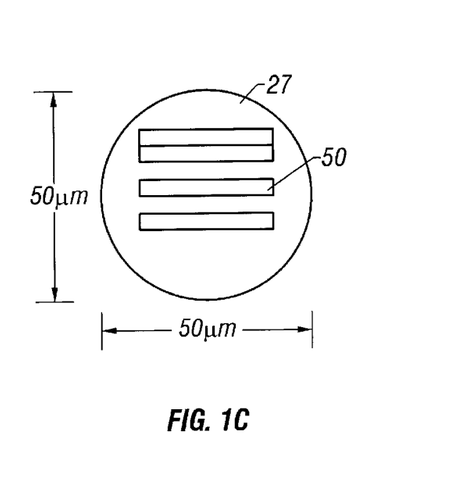
FIG. 1(c) illustrates reformatting the output beam of FIG. 1(b) into four 50 μm beams, provided a stacked reformatted beam that can be focused into a 50 μm fiber.

In FIG. 1(c), output beam 22 is shown as being reformatted into four 50 μm stacked beams with an overall height of 50 μm. Reformatted output 50 can be focussed into a 50 μm fiber 27. Output beam 22 is reformatted and sliced up so that reformatted output 50 becomes symmetrical. In this embodiment, reformatted output beam 50 is 16 times brighter than output beam 22.

Figure 1D:
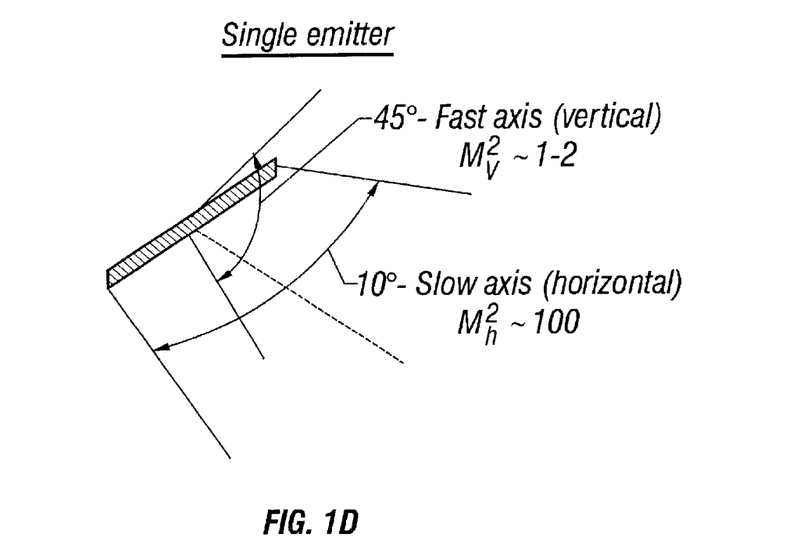
FIG. 1(d) illustrates beam divergence for a single emitter.
Figure 1E:
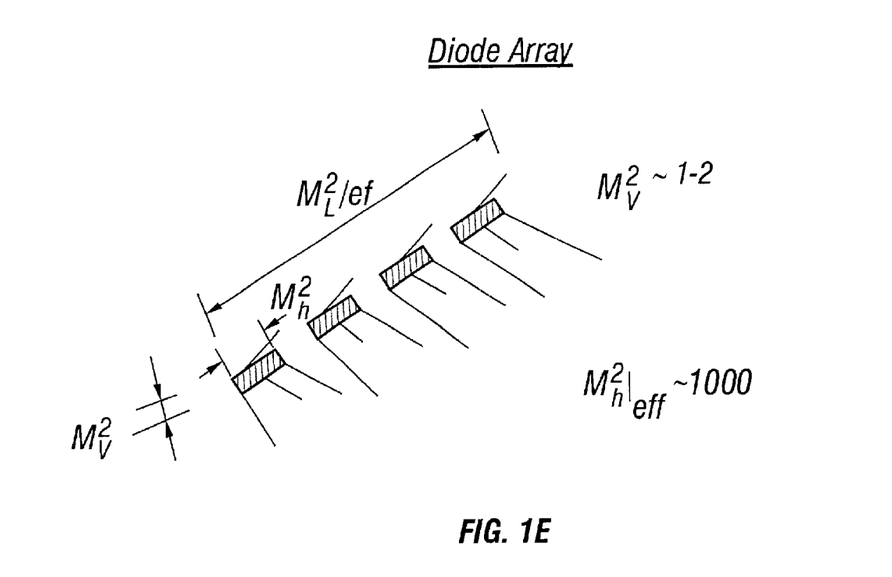
FIG. 1(e) illustrates beam divergence for a diode array.

Output beam divergence differences between a single emitter and a diode array are illustrated in FIGS. 1(d) and 1(e). In FIG. 1(d), for a single emitter the $m_v^2$ is about 1–2, the $m_h^2$ is about 100. As shown in FIG. 1(e), for a diode array the $m_v^2$ is about 1–2 while the $m_h^2$ is about 1000.

Another embodiment of optical device 10 is illustrated in FIGS. 2(a)–2(e) in which diode source 18 includes a plurality of emitters. In the embodiment of FIGS. 2(a)–2(e), diode source 18 is mounted on mount surface 14 at an angle θ relative to longitudinal axis 16.

A prism array 32 has a first prism face 34, a second prism face 36 and a third prism face 38. Prism array 32 has an angled surface 40 cut at the angle θ relative to a longitudinal axis 42 of prism array 32. First, second and third beams 22, 26 and 30 are incident on first, second and third prism faces 34, 36 and 38 respectively. Prism array 32 is positioned just above mount surface 14 in order to permit beams 22, 26 and 30 to be reflected from prism faces 34, 36 and 38 without striking prism array 32 or mounting surface 14.

Figure 2A:
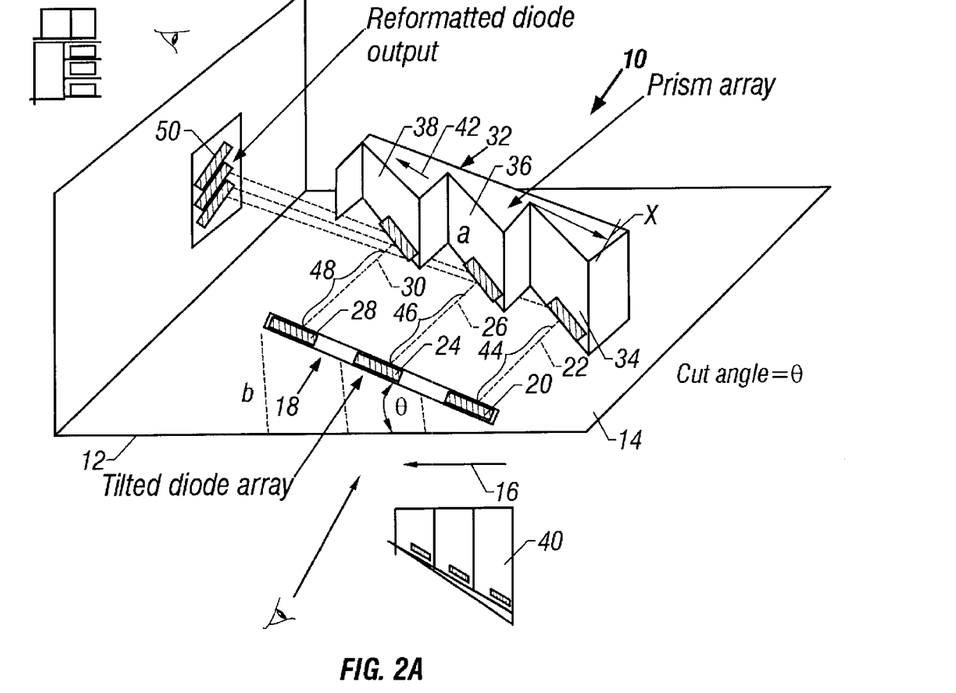
FIG. 2(a) is a perspective view of an embodiment of an optical device of the present invention with a tilted diode array and a prism array.
Figure 2B:
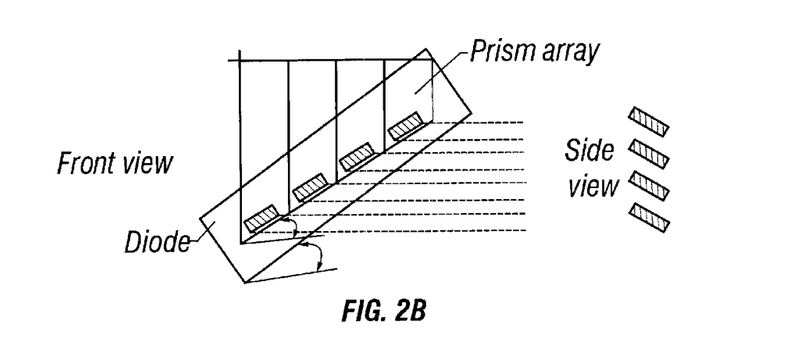
FIG. 2(b) is a front view of the optical device illustrated in FIG. 1(a).
Figure 2C:
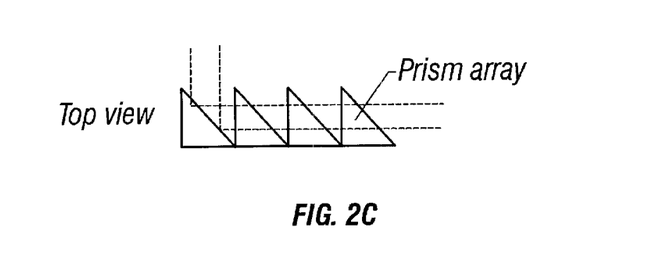
FIG. 2(c) is a top view or the optical device illustrated in FIG. 1(a).
Figure 2D:
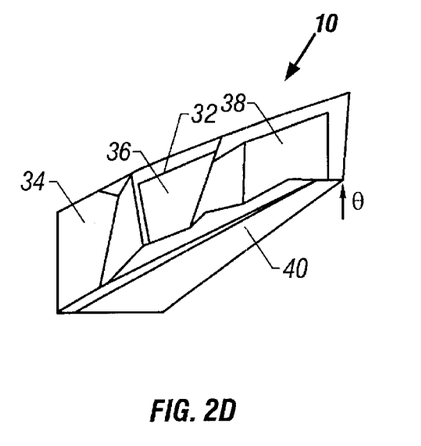
FIG. 2(d) is a bottom view, illustrating the mount surface, of the optical device of FIG. 2(a).
Figure 2E:
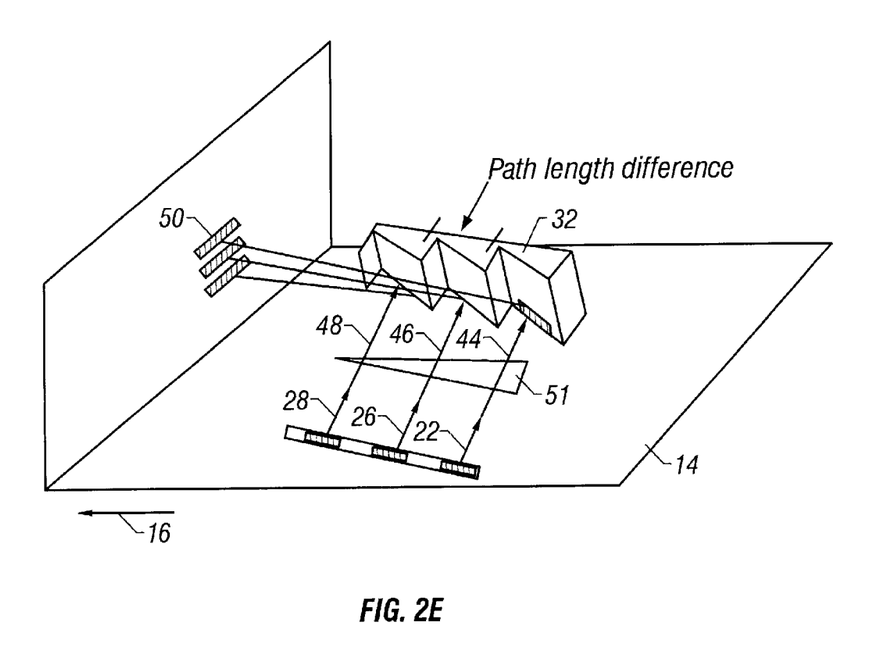
FIG. 2(e) is a perspective view of the apparatus of FIG. 2(a) with the inclusion of a prism.

Optical path lengths 44, 46 and 48 are formed between first, second and third diode emitters 20, 24 and 26 and first, second and third prism faces 34, 36 and 38. Optical path lengths 44, 46 and 48 are equal. First, second and third beams 22, 26 and 30 are reflected from prism faces 34, 36 and 38 to create a reformatted diode output 50. It will be appreciated that FIGS. 2(a)–2(d) depict three emitters 20, 22 and 24 and three prism faces 34, 36 and 38, the present invention can include any number of emitters and prism faces. Additionally, diode source 18 and prism array 32 can be positioned on separate mounts. As illustrated in FIG. 2(e), a prism 51 can be included to equalize path length differences of beams 22, 26 and 28 at prism array 32.

Diode source 18 can be a diode array or a diode bar. An example of a diode source 18 is model number, OPC-AO20-808-CS, a 20 W diode array, commercially available from Opto-Power, Tucson, Ariz. Optical path lengths 44. 46 and 48 can be in the range of 1 mm to 100 mm. θ can be in the range of 5 to 45°. When diode source 18 is a diode array or bar, θ is preferably 10–20°.

Prism faces 34, 36 and 38 are all parallel to each other. Prism array 32 includes a prism base formed as a monolithic structure. In various embodiments, prism array 32 is formed as an extruded structure, as a preform pulled in a similar manner as an optical fiber, machined or diamond turned. Prism array 32 can be made of a material such as copper that provides a sufficiently reflective surface that does not require a reflective coating.

Prism faces 34, 36 and 38 may be coated with a high reflector. One preferred coating is a high reflector at 810 nm. Prism faces 34, 36 and 38 are each cut an angle relative to longitudinal axis 42 in the range of 10–45°. In one embodiment, prism faces 34, 36 and 38 reflect beams 22, 26 and 30 at an angle of 90°. The optimal cut angle of prism faces 34, 36 and 38 is determined relative to the number of prism faces and their heights.

Diode emitters 20, 24 and 28 can have the same or different spacing. Diode source 18 can have a fill factor in the range of 20–80%. In one embodiment, the fill factor is 50%. Longitudinal axis 16 of diode source 18 is parallel to longitudinal axis 42 of prism array 32.

Reformatted diode output 50 has an $m_h^2$ that is improved by a factor equal to the number of emitters in diode source 18. Without prism array 32, $m_h^2$ for diode source 18 is represented by the following equation:

$$N \times S/W \times m^2_{(horizontal\ for\ each\ emitter)} = m^2_{(horizontal\ for\ diode\ source\ 18)};  \quad \text{Equation (1)}$$

where
 N is the number of emitters,
 W is the width of an emitter, and
 S is the distance between adjacent emitters+W.

Figure 3:
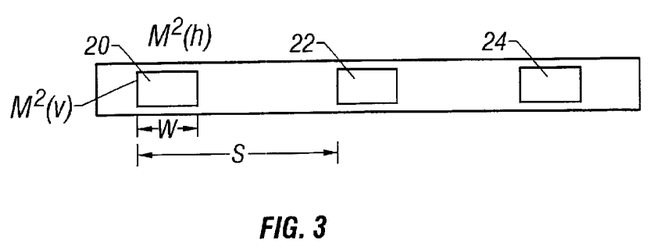
FIG. 3 is a close up view of the diode emitter of FIGS. 2(a)–e(e), illustrating positioning and distancing between adjacent emitters.

FIG. 3 illustrates the relative positioning of three emitters 20, 22 and 24, the width W of an emitter and distance S between adjacent emitters plus W.

Figure 4A:
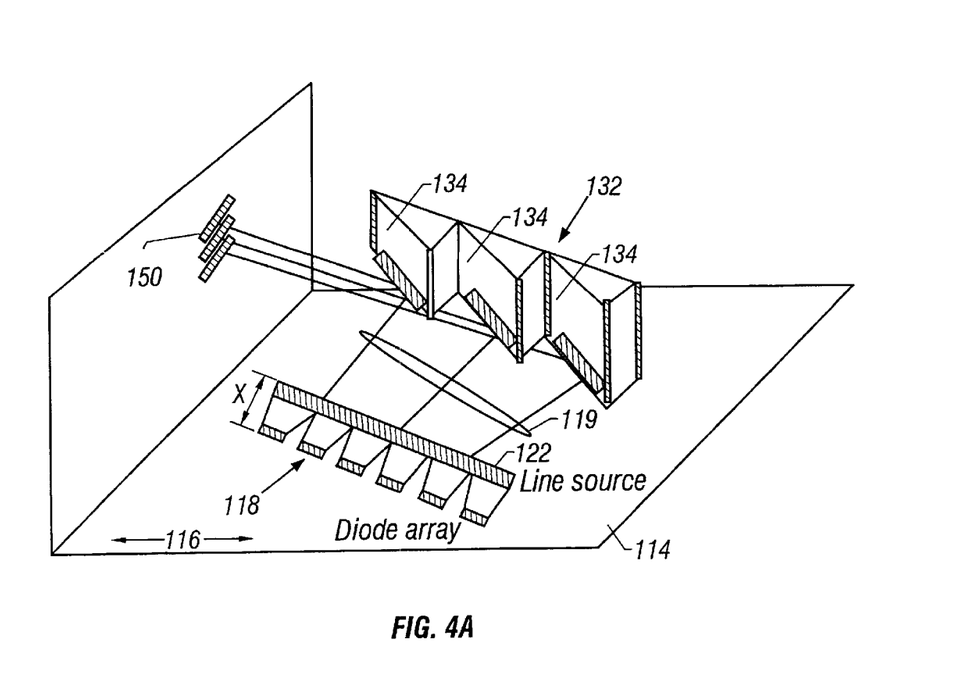
FIG. 4(a) is a perspective view of an embodiment of the optical device of the present invention with a multiple emitter diode array, a collimating lens and a prism array with two reflecting surfaces.
Figure 4B:
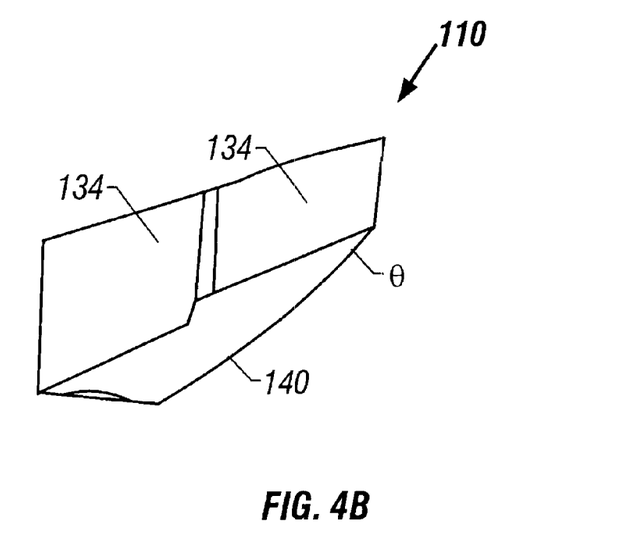
FIG. 4(b) is a perspective view illustrating the mount surface of the prism array of FIG. 4(a).

Referring to the embodiment illustrated in FIGS. 4(a) and 4(b), a diode source 118 includes six diode emitters 120. At a distance equal to "x" from diode source 118 the output beams from diode emitters 120 overlap and create an overlapped beam 122 which is a line source. A prism array 132 is positioned at a distance at least equal to x from diode source 118. In the embodiment illustrated in FIGS. 4(a) and 4(b), there are at least two prism faces 134 for any number of diode emitters 120. The number of diode emitters 120 preferably exceeds three.

Figure 4C:
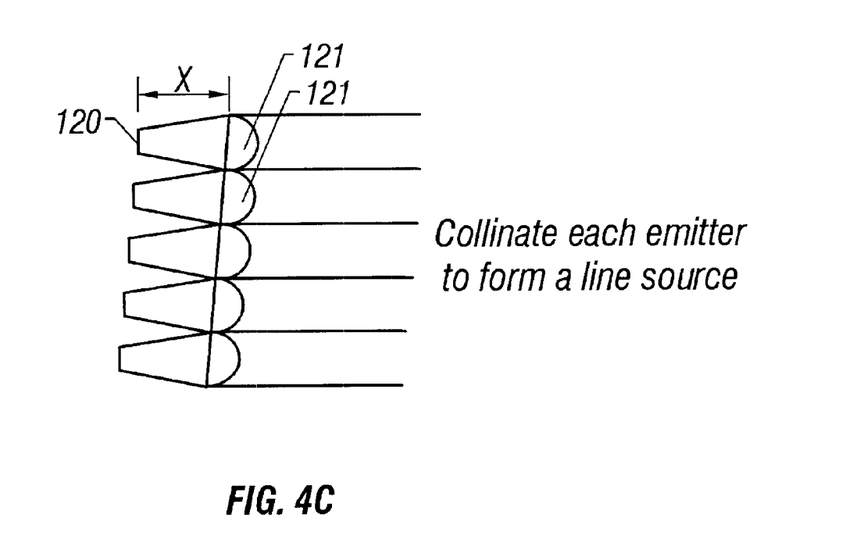
FIG. 4(c) illustrates the use of a cylindrical lens array in place of the collimating lens of FIG. 4(a).
Figure 4D:
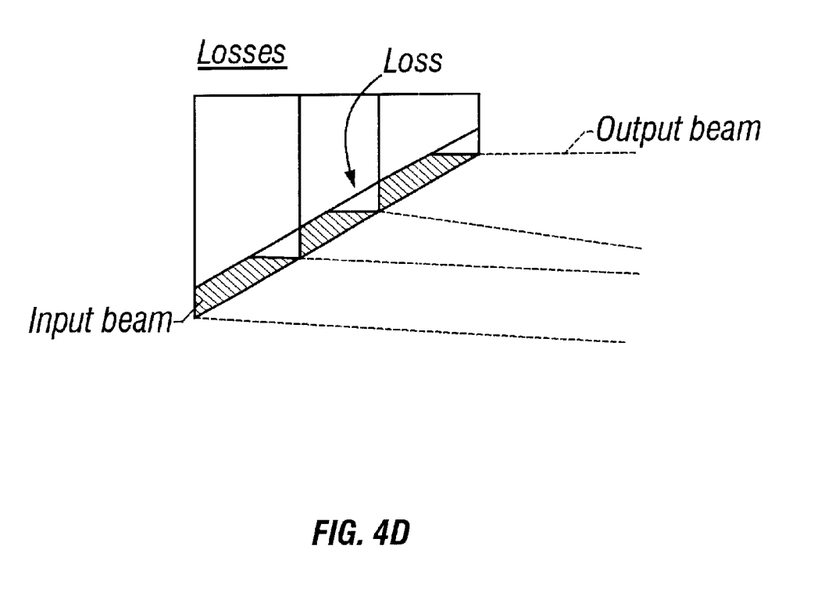
FIG. 4(d) illustrates the creation of edge losses with a collimating lens.
Figure 4E:
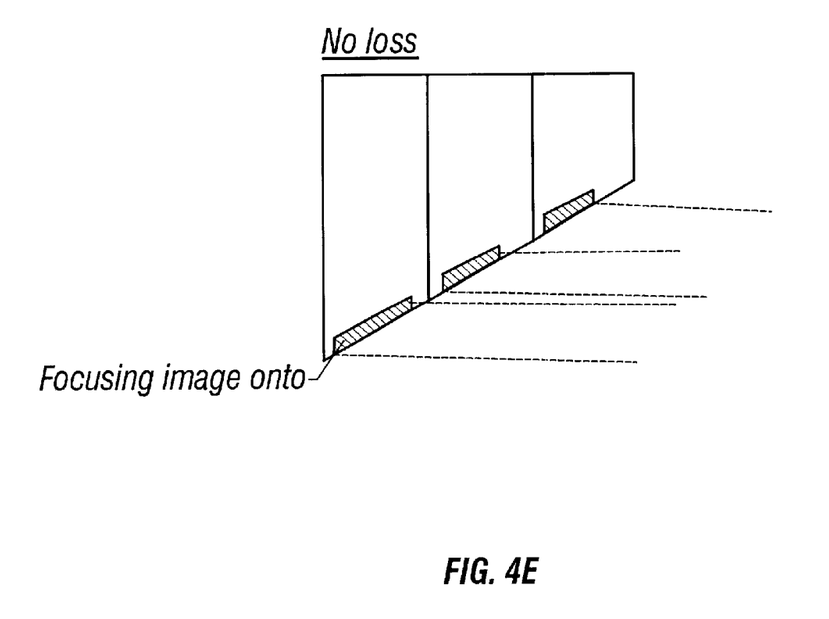
FIG. 4(e) illustrates the elimination of edge losses with the use of a cylindrical lens array.

Optionally included is a cylindrical lens 119 that collimates overlapped beam 122. Cylindrical lens 119 reduces the divergence of overlapped beam 122. Alternatively, each diode emitter 120 can be collimated with a cylindrical lens (FIG. 4(c)) by the use of a cylindrical lens array 121. FIG. 4(d) illustrates clip losses at the prism faces of prism array 132. As shown in FIG. 4(e), the clip losses are eliminated with the use of cylindrical lens array 121.

In the embodiment illustrated in FIGS. 4(a) and 4(b), prism array 132 includes two prism faces 134. Each of the prism faces 134 reflects ½ of overlapped beam 122 to produce a reformatted diode output 150. $M_h^2$ is reduced by the number of prism faces 134.

Diode source 118 is mounted on a mount surface 114 at an angle θ relative to longitudinal axis 116. Prism array 132 has an angled surface 140 cut at the angle θ relative to a longitudinal axis 142 of prism array 132. Prism array 132 and diode source 118 need not be mounted on the same mount surface 114.

As in the embodiment illustrated in FIGS. 2(a)–2(e), prism faces 134 are high reflectors. Again, a preferred coating is a high reflector at 810 nm. Prism faces 134 are each cut an angle relative to longitudinal axis 142 in the range of 10–45°.

Figure 5:
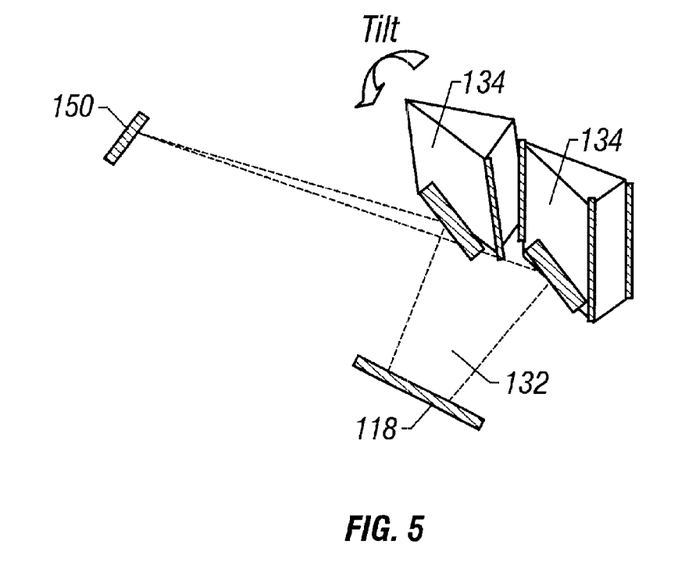
FIG. 5 illustrates an embodiment of the optical device of the present invention with a prism array with two reflecting surfaces that redirect the diode output into a single point.

FIG. 5 illustrates another embodiment of optical device 110. As shown in FIG. 5, prism faces 134 are tilted about 2–10°, preferably about 5°, and overlap in one spot 150. The creation of spot 150 provides a good pump source and is useful for fiber coupling applications.

Figure 6:
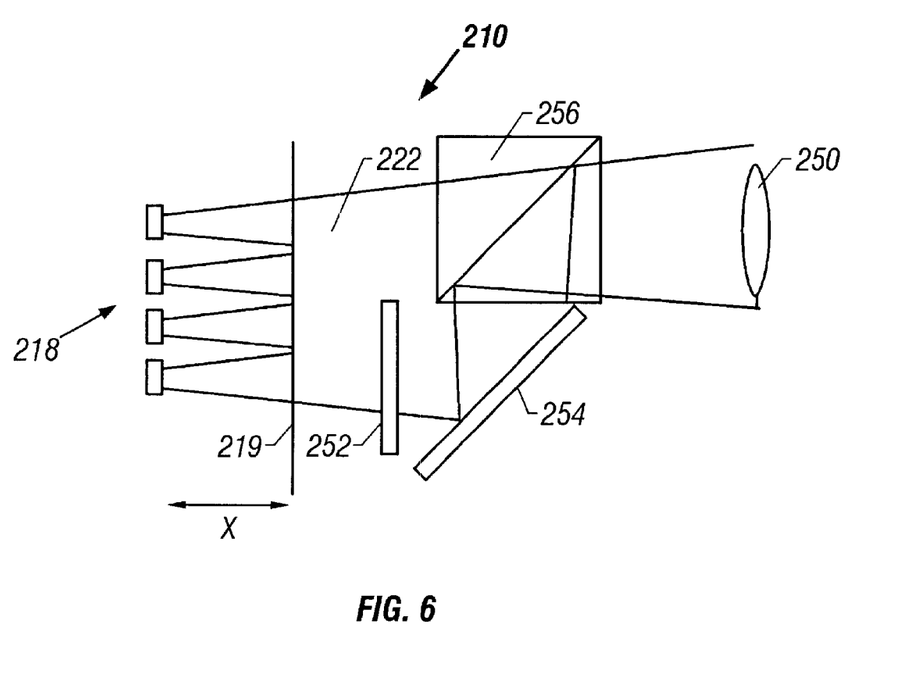
FIG. 6 illustrates an embodiment of the optical device of the present invention with a half wave plate and a polarizing cube.

In another embodiment illustrated in FIG. 6, optical device 210 includes a half-wave plate 252 and a turning mirror 254. One-half of beam 222 is incident on a polarizing cube and reflected. The other one-half of beam 222 is incident on half-wave plate 252 and turned 90°. Optionally included is a cylindrical lens 119. Reformatted output beam 250 is a single beam that is not stacked. In this embodiment, output beam has an improved $m^2$ at the expense of polarization and is enhanced using the prism array of FIGS. 1, and 2(a)–2(e).

In another embodiment illustrated in FIG. 6, optical device 210 includes a half-wave plate 252 and a turning mirror 254. A diode source 218 produces a plurality of output beams that collectively form an overlapped diode beam at a distance "x" from diode source 218. One-half of beam 222 is incident on a polarizing cube 256. The other one-half of beam 222 is incident on half-wave plate and turned 90°. Optionally included is a cylindrical lens 219.

Polarizing cube 256 creates a reformatted output beam 250 as a single beam that is not stacked. In this embodiment, output beam has an improved m² at the expense of polarization and is enhanced using the prism array of FIGS. 1, and 2(a)–2(e).

Figure 7A:
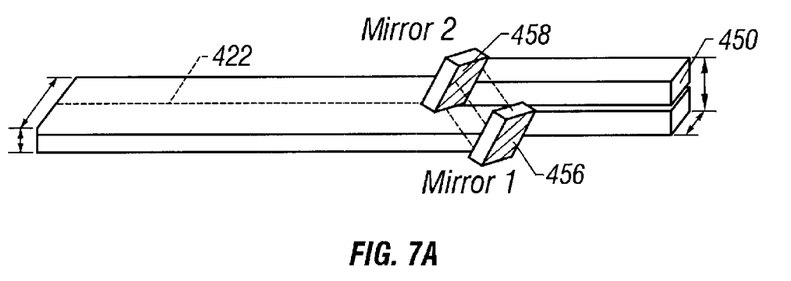
FIG. 7(a) illustrates an embodiment of an optical device of the present invention using two or more tilted mirrors to produce a reformatted output.
Figure 7B:
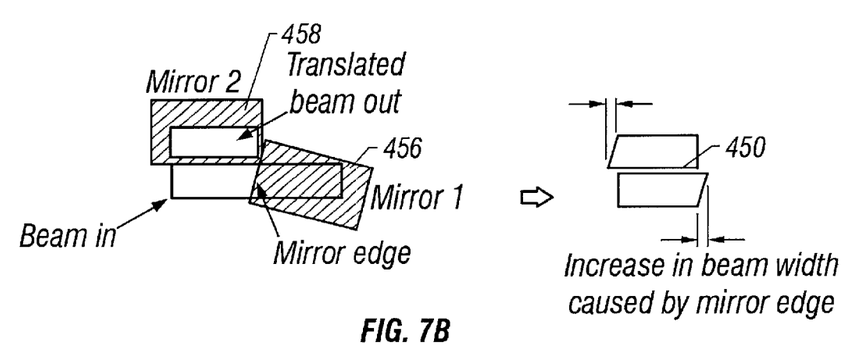
FIG. 7(b) is an end view of FIG. 7(a).
Figure 7C:
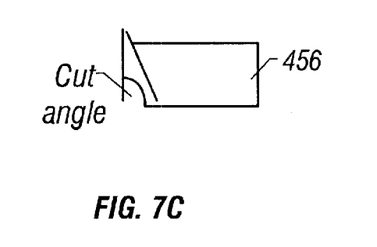
FIG. 7(c) illustrates that one side of the first mirror of the embodiment in FIG. 7(a) has an angled edge.

In another embodiment illustrated in FIGS. 7(a)–7(c), output beam 422, from a single or multiple emitter (not shown), is incident on a first mirror 456 and a second mirror 458. Mirrors 456 and 458 splice beam 422 and stacks it. One-half of beam 422 is not reflected by either mirror 456 or 458 and passes through. The other half of beam 422 is reflected off of mirror 456 to mirror 458 and is then stacked along with the first half of beam 422. Mirrors 456 and 458 can be formed from a unitary construction. In this embodiment, there is less loss and is particularly suitable for high power. Mirrors 456 and 458 have a tilt relative to each other. Because of the tilt, first mirror 456 has a non-perpendicular, angle cut first edge. Because of the tilt of the two mirrors 456 and 458, the cut edge of mirror 456 causes beam 422 to see a straight edge. Without the cut, the effect would be a beam 422 with a edge and the creation of a wider apparent beam as well as an increase in $m_h^2$. The cut edge of mirror 456 reduces $m_h^2$. Additionally, in this embodiment, more than two mirrors can be used.

Figure 8:
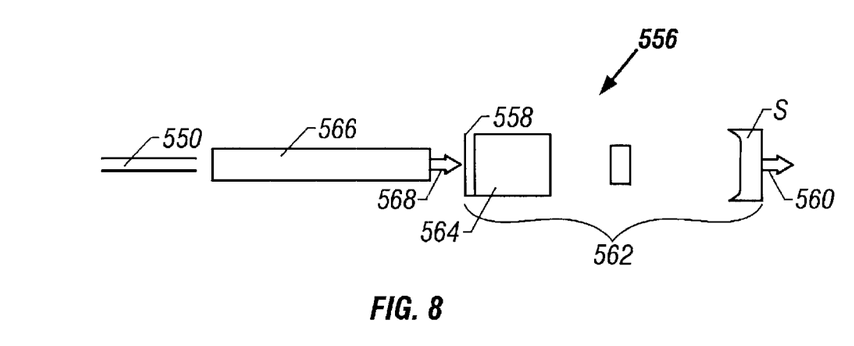
FIG. 8 illustrates the use of an optical device of the present invention in a laser system that includes a light pipe.

Referring now to FIG. 8, a laser 556 includes a high reflector 558 and an output coupler 560 which together define a laser cavity 562. A gain medium 564 is positioned in laser cavity 562. Reformatted output 550 is pumped into a light pipe 566 and delivers a pump beam 568 to laser cavity 562. Gain medium 564 can be end-pumped or side-pumped by pump beam 568.

Light pipe 566 can generate a quasi-top-hat pump beam with an intensity profile of pump beam 568 that is tailored to produce a parabolic temperature gradient across the gain medium 564. As used in this specification, a quasi-top-hat pump beam provides mode control if 20% or less of the energy resides outside the point at which the intensity falls to 50% of the peak. A sharp transition is provided from pumped to non-pumped regions of the gain medium and creates a soft-aperture. The sharp transition makes the heat source appear more homogeneous in the center of the gain media and appears like the boundary of the gain media in a conventional lamp-pumped rod laser. This boundary and the limited thermal conductivity of the gain media together form a parabolic temperature gradient across a gain media diameter. Additionally, the sharp transition defines a thermal boundary at the edge of the pump volume that acts like a mode limiting aperture and imposes a parabolic temperature gradient across the pump region. This allows TEMoo mode operation while limiting the aperture for other modes. At the boundary and outside the boundary the thermal lens is highly aberrated and prevents higher order mode operation.

The intensity profile of pump beam 568 can be tailored to produce the parabolic temperature gradient, an apertured laser cavity mode, a reduction of $TEM_{00}$ extraction efficiency and a reduction of an aspheric component of lensing of laser cavity 562. The Aspheric component of lensing in the central extraction region of gain medium 564 is removed by reducing the extraction in the edges of the pump volume. Tailoring the intensity profile of pump beam 568 can increase a damage threshold of gain medium 564 in the range of 150 to 200 percent. With a gaussian pump there is an intense central peak temperature and stress is created. With the top hat pump beam the intense central peak in temperature is flattened by a factor of 2–3, reducing stress by a similar amount.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An optical device, comprising:
   a mount including a mount surface with a longitudinal axis;
   a single emitter diode source coupled to the mount surface, the single emitter diode source producing a first beam with a relationship between a divergence and a spot size of the first beam being larger in one of a horizontal or vertical direction than the other;
   a prism array formed as an unitary structure and fixably positioned on the mount surface, the prism array including a plurality of individual reflective prism faces that collectively form a stepped, non-planer surface, the prism array being positioned relative to the single emitter diode source to redirect the first beam by the reflective prism faces and form a reformatted beam with an improved relationship between the divergence and the spot size of the first beam.

2. An optical device, comprising:
   a mount including a mount surface with a longitudinal axis;
   a diode source including a first diode emitter producing a first beam, a second diode emitter producing a second beam and a third diode emitter producing a third beam, the diode source being mounted on the mount surface at an angle θ relative to the longitudinal axis of the mount; and
   a prism array formed as a unitary structure and fixably positioned on the mount surface, the prism array including a first reflective prism face, a reflective second prism face and at least a third reflective prism face that collectively form a stepped, non-planar reflective surface, the prism array including an angled surface cut at the angle θ relative to a longitudinal axis of the prism array, the first, second and third beams being incident on the first, second and third prism faces respectively with equal optical path lengths between the first, second and third diode emitters relative to the first, second and third reflective prism faces.

3. The device of claim 2, wherein the angled surface of the prism array is positioned above the mount surface.

4. The device of claim 2, wherein the first, second and third prism faces are all parallel to each other.

5. The device of claim 2, wherein the prism array includes a prism base formed as a monolithic structure.

6. The device of claim 5, wherein the prism base is formed as an extruded structure.

7. The device of claim 2, wherein the first, second and third prism faces are each coated with a high reflection coating.

8. The device of claim 7, wherein the coating is a high reflector at 810 nm.

9. The device of claim 4, wherein the first, second and third prism faces are each cut at a angle relative to the longitudinal axis of the prism array in the range of 10–45°.

10. The device of claim 4, wherein the first, second and third prism faces reflect the first, second and third beams at an angle of 90°.

11. The device of claim 2, wherein the diode source is a diode array.

12. The device of claim 2, wherein the diode source is a diode bar.

13. The device of claim 2, wherein the diode source has a fill factor in the range of 20–80%.

14. The device of claim 2, wherein the diode source has a fill factor of 50%.

15. The device of claim 2, wherein the longitudinal axis of the diode source is non-parallel to the longitudinal axis of the prism array.

16. The device of claim 2, wherein the prism array reflects the first, second and third beams 90° relative to the longitudinal axis of the diode source.

17. An optical device, comprising:
a mount including a mount surface with a longitudinal axis;
a diode array including a number of diode emitters equal to n, the diode emitters producing a number of diode output beams equal to n, the diode source being mounted on the mount surface at an angle θ relative to the longitudinal axis of the mount; and
a prism array formed as a unitary unit and including an angled surface cut at the angle θ relative to a longitudinal axis of the prism array and fixably mounted above the mount surface, the prism array including a number of reflective prism faces equal to m, the number of diode output beams equal to n being incident on the number of prism faces equal to m, wherein m is less than n, wherein the reflective prism faces collectively form a stepped, non-planar reflective surface.

18. The device of claim 17, wherein m is equal to 2.

19. The device of claim 17, wherein the diode source is a diode bar.

20. An optical device, comprising:
a mount including a mount surface with a longitudinal axis;
a diode source including a number of diode emitters equal to n, the diode emitters producing a number of diode output beams equal to n, the diode source being mounted on the mount surface at an angle θ relative to the longitudinal axis of the mount, the diode output beams collectively forming a continuous line diode beam at a distance from the diode source equal to x; and
a prism array including an angled surface cut at the angle θ relative to a longitudinal axis of the prism array and mounted above the mount surface at a distance from the diode at least equal to x.

21. A laser system, comprising:
a high reflector and an output coupler defining a laser cavity;
a gain medium positioned in the laser cavity;
a mount including a mount surface with a longitudinal axis;
a diode source including a first diode emitter producing a first beam, a second diode emitter producing a second beam and a third diode emitter producing a third beam, the diode source being mounted on the mount surface at an angle θ relative to the longitudinal axis of the mount, the first, second and third beams collectively defining a pump beam;
a prism array including a first prism face, a second prism face and a third prism face, the prism array including an angled surface cut at the angle θ relative to a longitudinal axis of the prism array, the angled surface of the prism array being positioned on the mount surface, the first, second and third beams being incident on the first, second and third prism faces respectively with equal optical path lengths between the first, second and third diode emitters relative to the first, second and third prism faces; and
wherein an intensity profile of the pump beam is tailored to produce a parabolic temperature gradient across the gain medium.

22. The laser of claim 21, further comprising:
a light pipe coupled to the diode source, wherein the light pipe tailors the pump beam to produce the parabolic temperature gradient.

23. The laser of claim 21, further comprising:
a first optical fiber coupled to the diode source; and
a second optical fiber coupled to the first optical fiber and the laser cavity.

24. The laser of claim 21, wherein the quasi top hat pump beam apertures a laser cavity mode.

25. The laser of claim 22, wherein the light pipe is butt coupled to the gain medium.

26. The laser of claim 23, wherein the first optical fiber is butt coupled to the second optical fiber.

27. The laser of claim 23, wherein the beam is launched into the first optical fiber at a numerical aperture approaching a limiting numerical aperture of the first optical fiber.

28. A laser, comprising:
a high reflector and an output coupler defining a laser cavity;
a gain medium positioned in the laser cavity;
a mount including a mount surface with a longitudinal axis;
a diode source including a first diode emitter producing a first beam, a second diode emitter producing a second beam and a third diode emitter producing a third beam, the diode source being mounted on the mount surface at an angle θ relative to the longitudinal axis of the mount, the first, second and third beams collectively defining a pump beam;
a prism array including a first prism face, a second prism face and a third prism face, the prism array including an angled surface cut at the angle θ relative to a longitudinal axis of the prism array, the angled surface of the prism array being positioned on the mount surface, the first, second and third beams being incident on the first, second and third prism faces respectively with equal optical path lengths between the first, second and third diode emitters relative to the first, second and third prism faces; and
means for modifying the pump beam to produce a quasi top hat pump beam with a modified intensity profile that produces a parabolic temperature gradient.

29. The laser of claim 28, wherein the quasi top hat pump beam provides a sharp transition from a pumped to a non-pumped region of the gain medium.

30. The laser of claim 28, wherein the quasi top hat pump beam provides mode control of the laser cavity.

31. The laser of claim 28, wherein the means for modifying the pump beam is a light pipe coupled to the diode source.

32. The laser of claim 31, wherein the light pipe is butt coupled to the gain medium.

* * * * *